(12) United States Patent
Blachut et al.

(10) Patent No.: US 12,322,588 B2
(45) Date of Patent: Jun. 3, 2025

(54) STIMULUS RESPONSIVE POLYMER FILMS AND FORMULATIONS

(71) Applicant: Lam Research Corporation, Fremont, CA (US)

(72) Inventors: Gregory Blachut, Campbell, CA (US); Diane Hymes, San Jose, CA (US); Stephen M. Sirard, Austin, TX (US)

(73) Assignee: Lam Research Corporation, Fremont, CA (US)

( * ) Notice: Subject to any disclaimer, the term of this patent is extended or adjusted under 35 U.S.C. 154(b) by 571 days.

(21) Appl. No.: 17/639,850

(22) PCT Filed: Sep. 1, 2020

(86) PCT No.: PCT/US2020/070483
§ 371 (c)(1),
(2) Date: Mar. 2, 2022

(87) PCT Pub. No.: WO2021/046572
PCT Pub. Date: Mar. 11, 2021

(65) Prior Publication Data
US 2022/0301859 A1    Sep. 22, 2022

Related U.S. Application Data

(60) Provisional application No. 62/895,901, filed on Sep. 4, 2019.

(51) Int. Cl.
*H01L 21/02* (2006.01)
*B05D 1/00* (2006.01)
(Continued)

(52) U.S. Cl.
CPC .......... *H01L 21/02118* (2013.01); *B05D 1/60* (2013.01); *C09D 5/26* (2013.01);
(Continued)

(58) Field of Classification Search
CPC ......... H01L 21/02057; H01L 21/02118; H01L 21/02271; H01L 23/3192; B05D 1/60;
(Continued)

(56) References Cited

U.S. PATENT DOCUMENTS 4,753,830 A    6/1988    Matsuda et al.
5,441,695 A    8/1995    Gladden
(Continued)

FOREIGN PATENT DOCUMENTS

CN    1027419 C    1/1995
CN    1531745 A    9/2004
(Continued)

OTHER PUBLICATIONS

International Preliminary Report on Patentability dated Mar. 17, 2022 in PCT Application No. PCT/US2020/048955.
(Continued)

*Primary Examiner* — Monica D Harrison
(74) *Attorney, Agent, or Firm* — Weaver Austin Villeneuve & Sampson LLP

(57) ABSTRACT

Formulations for forming stimulus responsive polymers (SRPs) on semiconductor substrates include organic weak acids. Methods of protecting sensitive substrates including forming an SRP layer on sensitive substrates and forming one or more cap layers on the SRP layer.

22 Claims, 5 Drawing Sheets

(51) Int. Cl.
  *C09D 5/26* (2006.01)
  *C09D 7/63* (2018.01)
  *C23C 16/34* (2006.01)
  *C23C 16/40* (2006.01)
  *H01L 23/31* (2006.01)

(52) U.S. Cl.
  CPC .............. *C09D 7/63* (2018.01); *C23C 16/34* (2013.01); *C23C 16/40* (2013.01); *H01L 21/02057* (2013.01); *H01L 21/02271* (2013.01); *H01L 23/3192* (2013.01)

(58) Field of Classification Search
  CPC .... C09D 5/26; C09D 7/63; C23L 6/34; C23L 6/40
  USPC ........................................................ 438/780
  See application file for complete search history.

(56) References Cited

U.S. PATENT DOCUMENTS

| | | | |
|---|---|---|---|
| 5,571,447 A | 11/1996 | Ward et al. | |
| 5,731,229 A | 3/1998 | Kato et al. | |
| 6,271,273 B1 * | 8/2001 | You | H01L 21/02126 |
| | | | 521/154 |
| 6,337,277 B1 | 1/2002 | Chou et al. | |
| 6,573,201 B1 | 6/2003 | Ogure et al. | |
| 7,011,716 B2 | 3/2006 | Xu et al. | |
| 8,318,866 B2 | 11/2012 | Kurz et al. | |
| 9,466,511 B2 | 10/2016 | Limary et al. | |
| 10,662,274 B2 | 5/2020 | Kohl et al. | |
| 11,104,790 B1 | 8/2021 | Lomazoff et al. | |
| 11,862,473 B2 | 1/2024 | Sirard et al. | |
| 12,119,218 B2 | 10/2024 | Sirard et al. | |
| 2003/0224586 A1 | 12/2003 | Sabnis | |
| 2004/0040653 A1 | 3/2004 | Nuzzo et al. | |
| 2004/0087176 A1 | 5/2004 | Colburn et al. | |
| 2004/0146803 A1 | 7/2004 | Kohl et al. | |
| 2005/0106493 A1 | 5/2005 | Ho et al. | |
| 2006/0089003 A1 | 4/2006 | Cheng et al. | |
| 2006/0257758 A1 | 11/2006 | Daley et al. | |
| 2008/0004203 A1 | 1/2008 | Scheuing et al. | |
| 2009/0130863 A1 | 5/2009 | Toma et al. | |
| 2009/0142931 A1 | 6/2009 | Wang et al. | |
| 2009/0286188 A1 | 11/2009 | Hatakeyama et al. | |
| 2010/0003781 A1 | 1/2010 | Van Duren et al. | |
| 2010/0255303 A1 | 10/2010 | Wardle et al. | |
| 2011/0189858 A1 | 8/2011 | Yasseri et al. | |
| 2013/0008868 A1 | 1/2013 | Uozumi et al. | |
| 2014/0242623 A1 | 8/2014 | Phillips et al. | |
| 2014/0253137 A1 | 9/2014 | Chuang et al. | |
| 2014/0373384 A1 | 12/2014 | Sirard et al. | |
| 2015/0024256 A1 | 1/2015 | Anandan et al. | |
| 2015/0221500 A1 | 8/2015 | Ogihara et al. | |
| 2015/0228533 A1 | 8/2015 | Hwang et al. | |
| 2016/0086829 A1 | 3/2016 | Limary et al. | |
| 2016/0254162 A1 | 9/2016 | Okutani et al. | |
| 2017/0098541 A1 | 4/2017 | Gouk et al. | |
| 2017/0273192 A1 | 9/2017 | Sato et al. | |
| 2017/0345683 A1 | 11/2017 | Sasaki et al. | |
| 2018/0155483 A1 | 6/2018 | Kohl et al. | |
| 2018/0204770 A1 | 7/2018 | Varaprasad et al. | |
| 2018/0308695 A1 | 10/2018 | Lavoie et al. | |
| 2018/0315725 A1 | 11/2018 | Lin et al. | |
| 2018/0335697 A1 | 11/2018 | Wang et al. | |
| 2019/0015878 A1 | 1/2019 | Kawaguchi et al. | |
| 2019/0088470 A1 | 3/2019 | Varaprasad et al. | |
| 2019/0385903 A1 | 12/2019 | Kikuchi et al. | |
| 2020/0013613 A1 | 1/2020 | Blanquart | |
| 2020/0040282 A1 | 2/2020 | Aoki et al. | |
| 2022/0328338 A1 | 10/2022 | Blachut et al. | |
| 2023/0178364 A1 | 6/2023 | Blachut et al. | |
| 2023/0207305 A1 | 6/2023 | Sirard et al. | |
| 2023/0295412 A1 | 9/2023 | Sirard et al. | |
| 2024/030023 A1 | 1/2024 | Sirard et al. | |
| 2024/0312778 A1 | 9/2024 | Banik, II et al. | |

FOREIGN PATENT DOCUMENTS

| | | |
|---|---|---|
| CN | 101828249 A | 9/2010 |
| CN | 103959395 A | 7/2014 |
| CN | 105237578 A | 1/2016 |
| CN | 105448778 A | 3/2016 |
| CN | 106459446 A | 2/2017 |
| CN | 108697810 A | 10/2018 |
| EP | 3366639 A1 | 8/2018 |
| JP | S5351963 A | 5/1978 |
| JP | H05341536 A | 12/1993 |
| JP | H0776741 A | 3/1995 |
| JP | H07245332 A | 9/1995 |
| JP | H09275085 A | 10/1997 |
| JP | H1121496 A | 1/1999 |
| JP | 2005070535 A | 3/2005 |
| JP | 2005109390 A | 4/2005 |
| JP | 2005183751 A | 7/2005 |
| JP | 2005251901 A | 9/2005 |
| JP | 2006504853 A | 2/2006 |
| JP | 2007157768 A | 6/2007 |
| JP | 2012049446 A | 3/2012 |
| JP | 2013016699 A | 1/2013 |
| JP | 2013021208 A | 1/2013 |
| JP | 2015092619 A | 5/2015 |
| JP | 2015106645 A | 6/2015 |
| JP | 2016032063 A | 3/2016 |
| JP | 2017152600 A | 8/2017 |
| JP | 2020187368 A | 11/2020 |
| KR | 20010004411 A | 1/2001 |
| KR | 20090006551 A | 1/2009 |
| KR | 20160033624 A | 3/2016 |
| KR | 101827020 B1 | 3/2018 |
| TW | 200813212 A | 3/2008 |
| TW | 201635406 A | 10/2016 |
| TW | 201712752 A | 4/2017 |
| TW | 201730273 A | 9/2017 |
| WO | WO-2014161036 A1 | 10/2014 |
| WO | WO-2020033015 A2 | 2/2020 |
| WO | WO-2020160016 A1 | 8/2020 |
| WO | WO-2020161879 A1 | 8/2020 |
| WO | WO-2021030252 A1 | 2/2021 |
| WO | WO-2021046572 A1 | 3/2021 |
| WO | WO-2021231307 A1 | 11/2021 |
| WO | WO-2022006349 A1 | 1/2022 |
| WO | WO-2022026323 A1 | 2/2022 |

OTHER PUBLICATIONS

International Preliminary Report on Patentability dated Mar. 17, 2022 in PCT Application No. PCT/US2020/070483.
KR Office Action dated Apr. 29, 2022, in Application No. KR10-2015-0131204 with English translation.
Chinese First Office Action dated Nov. 27, 2017 issued in Application No. CN 201510593234.6.
Feinberg, et al., "Cyclic Poly(phthalaldehyde): Thermoforming a Bulk Transient Material" ACS Macro Lett., 2018, vol. 7, pp. 47-52.
International Search Report and Written Opinion dated Dec. 18, 2020, in Application No. PCT/US2020/070483.
International Preliminary Report on Patentability dated Aug. 12, 2021 issued in Application No. PCT/US2020/015451.
International Search Report and Written Opinion dated Dec. 15, 2020 issued in Application No. PCT/US2020/048955.
International Search Report and Written Opinion dated Jan. 3, 2022 in Application No. PCT/US2021/049713.
International Search Report and Written Opinion dated May 27, 2020 issued in Application No. PCT/US2020/015451.
International Search Report and Written Opinion dated Nov. 18, 2021, in PCT Application No. PCT/US2021/042978.
International Search Report and Written Opinion dated Oct. 26, 2021, in application No. PCT/US2021/040009.
International Search Report and Written Opinion mailed on Aug. 25, 2021, in Application No. PCT/US2021/031594.
International Search Report and Written Opinion mailed on Aug. 30, 2021, in PCT Application No. PCT/US2021/031595.

(56) References Cited

OTHER PUBLICATIONS

Kaitz, J. A. et al., "End Group Characterization of Poly(Phthalaldehyde): Surprising Discovery of a Reversible, Cationic Macrocyclization Mechanism", Journal of the American Chemical Society, 2013, vol. 135, pp. 12755-12761.
Notice of Allowance dated Jun. 8, 2016 issued in U.S. Appl. No. 14/489,615.
Office Action dated Mar. 8, 2016 issued in U.S. Appl. No. 14/489,615.
Schwartz, J. M. et al., "Stable, high-molecular-weight poly(phthalaldehyde)", Journal of polymer science, part A: polymer chemistry, 2016, vol. 55, pp. 1166-1172.
Taiwanese First Office Action dated Dec. 11, 2020 issued in Application No. TW 109112730.
TW Decision of Refusal dated Sep. 14, 2021, in application No. TW109112730 with English translation.
U.S. Appl. No. 17/310,303, inventors Sirard et al., filed Jul. 27, 2021.
U.S. Appl. No. 17/639,869, inventors Blachut Gregory et al., filed Mar. 2, 2022.
Alojaly, H., et al., "Packaging With Plastics and Polymeric Materials," Reference Module in Materials Science and Materials Engineering, Elsevier, 2020, ISBN 9780128035818, pp. 1-17.
Bhadha P M., "How Weld Hose Materials Affect Shielding Gas Quality," Welding Journal, 1999, pp. 35-40.
CN Office Action dated Dec. 15, 2023 in CN Application No. 202080011611.X with English translation.
CN Office Action dated Jun. 12, 2024 in CN Application No. 202080062440.3, with English Translation.
CN Office Action dated Nov. 2, 2024 in CN Application No. 202080062618.4 with English translation.
CN Office Action dated Oct. 24, 2023, in Application No. CN202080062440.3 with English translation.
International Preliminary Report on Patentability and Written Opinion dated Apr. 11, 2024 in PCT Application No. PCT/US2022/044750.
International Preliminary Report on Patentability dated Feb. 9, 2023 in PCT Application No. PCT/US2021/042978.
International Preliminary Report on Patentability dated Jan. 12, 2023, in PCT Application No. PCT/US2021/040009.
International Preliminary Report on Patentability dated Mar. 23, 2023 in Application No. PCT/US2021/049713.
International Preliminary Report on Patentability dated Nov. 24, 2022, in PCT Application No. PCT/U82021/031595.
International Preliminary Report on Patentability dated Nov. 24, 2022, in PCT Application No. PCT/US2021/031594.
International Search Report and Written Opinion dated Jan. 12, 2023 in PCT Application No. PCT/US2022/044750.
International Search Report and Written Opinion dated Jan. 22, 2024 in PCT Application No. PCT/US2023/034707.
JP Office Action dated Feb. 6, 2024 in JP Application No. 2021-544131, with English Translation.
JP Office Action dated Jul. 23, 2024 in JP Application No. 2021-544131 with English translation.
JP Office Action dated May 16, 2023 in Application No. JP2022-568696 with English translation.
KR Office Action dated Mar. 19, 2023, in Application No. KR10-2022-7043224 with English translation.
KR Office Action dated Oct. 28, 2024 in KR Application No. 10-2021-7027191 with English Translation.
KR Office Action dated Sep. 25, 2023, in Application No. KR10-2022-7043224 with English translation.
SG Office Action dated Oct. 10, 2023, in application No. SG11202202088Q.
SG Search Report and Written Opinion dated Dec. 16, 2022 in Application No. SG11202108294U.
SG Search Report and Written Opinion dated Jan. 16, 2024 in SG Application No. 11202202086R.
SG Search report and Written Opinion dated Sep. 10, 2024 in Application No. 11202260064V.
SG Written Opinion dated Apr. 19, 2024 in SG Application No. 11202108294U.
TW Office Action dated Jan. 8, 2024 in TW Application No. 109102787 with English Translation.
TW Office Action dated Jun. 7, 2024 in TW Application No. 109130167 with English translation.
TW Office Action dated Nov. 11, 2022, in Application No. TW109112730 with English Translation.
TW Office Action dated Nov. 21, 2024 in TW Application No. 109130167 with English translation.
U.S. Non-Final Office Action dated Dec. 27, 2023 in U.S. Appl. No. 17/310,303.
U.S. Non-Final Office Action dated Mar. 8, 2023 in U.S. Appl. No. 17/998,489.
U.S. Notice of Allowance dated Jul. 11, 2023 in U.S. Appl. No. 17/998,489.
U.S. Notice of Allowance dated Jun. 5, 2024 in U.S. Appl. No. 17/310,303.
U.S. Notice of Allowance dated Sep. 9, 2024 in U.S. Appl. No. 17/310,303.
U.S. Notice of Allowance dated Sep. 11, 2024 in U.S. Appl. No. 17/310,303.
U.S. Appl. No. 18/695,337, inventors Sirard S.M, et al., filed Mar. 25, 2024.
U.S. Appl. No. 18/826,414, inventors Sirard S.M, et al., filed Sep. 6, 2024.
U.S. Restriction Requirement dated Jul. 16, 2024 in U.S. Appl. No. 17/639,869.
Uzunlar, E. et al., "Decomposable and Template Polymers: Fundamentals and Applications", Journal of Electronic Packaging, Apr. 19, 2016, vol. 138, No. 2, pp. 1-15.
Uzunlar, E et al., "Size-Compatible, Polymer-Based Air-Gap Formation Processes, and Polymer Residue Analysis for Wafer-Level MEMS Packaging Applications," Journal of Electronic Packaging, 2015, vol. 137(4), pp. 1-13.
Wood, J.D. et al., "Annealing Free, Clean Graphene Transfer Using Alternative Polymer Scaffolds", Nanotechnology, Jan. 12, 2015, vol. 26, No. 5, pp. 1-9.
Yadav, R K. et al., "In Situ Prepared Flexible 3D Polymer Film Photocatalyst for Highly Selective Solar Fuel Production from $CO_2$," ChemCatChem, 2018, vol. 10(9), pp. 2024-2029.

\* cited by examiner

STIMULUS RESPONSIVE POLYMER FILMS AND FORMULATIONS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

During semiconductor fabrication, many surfaces are sensitive to airborne molecular contaminants (AMCs) in the surrounding environment. Queue time can lead to exposure to the AMCs and unwanted interactions such as oxidation, corrosion, and halogenation. Solutions include storing partially fabricated semiconductor substrates in nitrogen ($N_2$)-filled storage cassettes or rooms and using integrated tools that support multiple processes without breaking the vacuum on the substrates. These solutions are difficult and expensive to implement and pose safety and reliability concerns.

Furthermore, as semiconductor devices continue to scale down to smaller sizes, higher aspect ratio structures are used to achieve the desired device performance. The fabrication of semiconductor devices involves multiple iterations of processes such as material deposition, planarization, feature patterning, feature etching, and feature cleaning. The drive towards higher aspect ratio structures creates processing challenges for many of these traditional fabrication steps. Wet processes such as etch and clean, which may make up greater than 25% of the overall process flow, are particularly challenging on high aspect ratio (HAR) features due to the capillary forces that are generated during drying. The strength of these capillary forces depends on the surface tension and contact angle of the etch, clean, or rinse fluids that are being dried, as well as the feature spacing and aspect ratio. If the forces generated during drying are too high, then the high aspect ratio features will collapse onto each other and stiction may occur. Feature collapse and stiction will severely degrade the device yield.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Formulations for forming stimulus responsive polymers (SRPs) on semiconductor substrates including organic weak acids are described. SRP layers formed from the formulations exhibit accelerated degradation characteristics compared to neat SRP. Also described are methods of protecting sensitive substrates including forming an SRP layer on sensitive substrates and forming one or more cap layers on the SRP layer.

Aspects of the disclosure relate to methods of protecting a surface. In some embodiments, a method includes forming an SRP layer, wherein the SRP layer is a layer including a stimulus responsive polymer (SRP), the SRP characterized by a ceiling temperature ($T_c$) at which the SRP is in thermal equilibrium with its monomers, the T, being between −80° C. and 400° C., on a sensitive surface of a substrate; and forming one or more cap layers on the SRP layer.

In some embodiments, the method further includes exposing the substrate including the SRP layer and one or more cap layers to ambient conditions for a predetermined period.

In some such embodiments, the method further includes removing the one or more cap layers and the SRP layer. In some embodiments, the one or more cap layers are removed prior to completing removal of the SRP layer. In some embodiments, the one or more cap layers are removed by peeling. In some embodiments, the one or more cap layers are removed by exposure to a solvent or plasma. In some such embodiments, the solvent is removed or the plasma is extinguished while the SRP layer is covering the sensitive surface. In some embodiments, removing the one or more cap layers includes depolymerizing the SRP and lifting off the one or more cap layers from the substrate.

In some embodiments, forming the one or more cap layers includes maintaining the substrate temperature at no more than the ceiling temperature of the SRP. In some embodiments, the one or more cap layers are inorganic layers. In some embodiments, the one or more cap layers include one or more of: $SiO_x$, $SnO_x$, $AlO_x$, $TiO_x$, $ZrO_x$, $HfO_x$, and $ZnO_x$, and nitride films such as SiN, wherein x is a number greater than 0.

In some embodiments, the one or more cap layers include one or more polymer layers. In some embodiments, the SRP includes a poly(phthalaldehyde), a poly(aldehyde), a poly(benzyl carbamate), a poly(benzyl ether), a poly(alpha-methyl styrene), a poly(carbonate), a poly(norbornene), a poly(olefin sulfone), a poly(glyoxylate), a poly(ester), or a poly(methyl methacrylate), as well as derivatives thereof, as a homopolymer or a constituent polymer of a copolymer. In some embodiments, one of the one or more cap layers is polytetrafluoroethylene, polyethylene polyacrylates, polystyrene, polyimides, polyamides, polyesters, polyurea, polyaldehydes, and polyurethanes. In some embodiments, the SRP and the one or more cap layers are deposited by vapor deposition.

Another aspect of the disclosure relates to a formulation including: a stimulus responsive polymer (SRP) characterized by a ceiling temperature ($T_c$) at which the SRP is in thermal equilibrium with its monomers, the $T_c$ being between −80° C. and 400° C.; and an organic acid having a pKa≥1, wherein the SRP:organic acid wt % is at least 1:1.

In some embodiments, the SRP includes a poly(phthalaldehyde), a poly(aldehyde), a poly(benzyl carbamate), a poly(benzyl ether), a poly(alpha-methyl styrene), a poly(carbonate), a poly(norbornene), a poly(olefin sulfone), a poly(glyoxylate), a poly(ester), or a poly(methyl methacrylate), as well as derivatives thereof, as a homopolymer or a constituent polymer of a copolymer. In some embodiments, the $T_c$ is less than 200° C. In some embodiments, the $T_c$ is greater than 150° C.

In some embodiments, the SRP and organic acid are in a solution, the solution including a solvent, the SRP, and the organic acid, wherein the wt % of the SRP in the solution is between 1% and 20%.

In some such embodiments, the solvent is selected from diglyme, tetrahydrofuran, N-methyl-pyrrolidone, dimethylformamide, propylene carbonate, cyclopentanone, anisole, dichlorobenzene, propylene glycol methyl ether acetate, and 2-ethoxyethyl acetate.

In some embodiments, the organic acid is a linear alkyl carboxylic acid CXH2XO2, where X is an integer, a corresponding dicarboxylic acid variant, or a derivative thereof.

In some embodiments, the organic acid is one of methanoic acid, acetic acid, oxalic acid, tartaric acid, ethanedioic acid, propanedioic acid, oxoethanoic acid, 2-hydroxyethanoic acid, prop-2-enoic acid, 2-propynoic acid, 2-hydroxypropanedioic acid, oxopropanedioic acid, 2,2-dihydroxypropanedioic acid, 2-oxopropanoic acid, 2-hydroxypropanoic acid, 3-hydroxypropanoic acid, and 2,3-dihydroxypropanoic acid.

DETAILED DESCRIPTION

Stimuli responsive polymers (SRPs) may be used in semiconductor fabrication processes for sacrificial bracing of high aspect ratio (HAR) structures and queue-time extension.

Figure 1A:
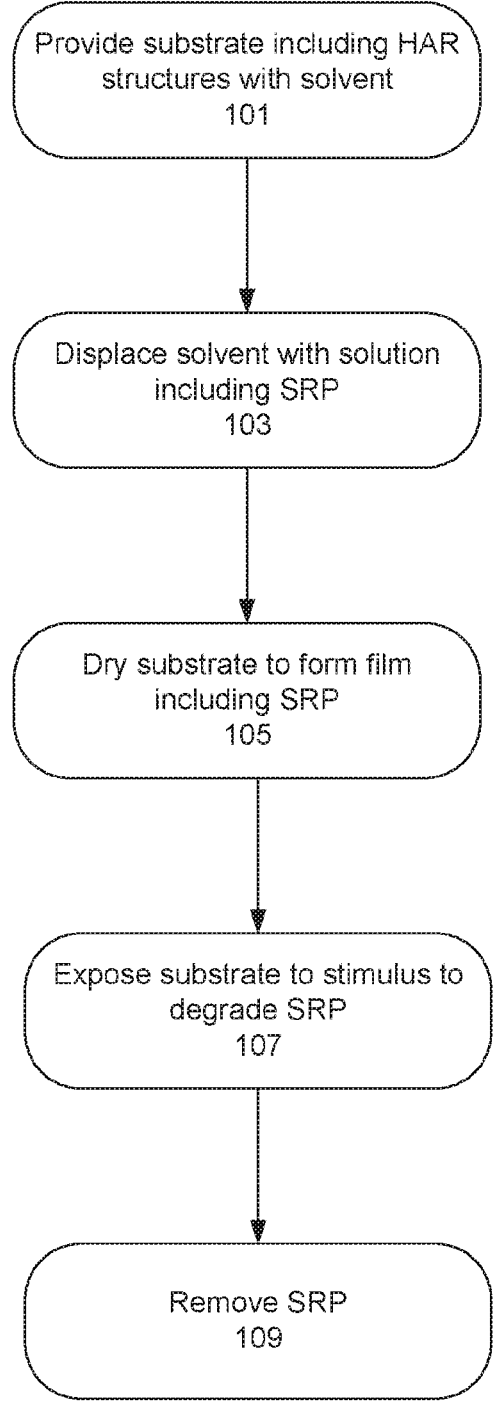
FIG. 1A is a flow diagram showing an example of a method of bracing high aspect ratio (HAR) structure using a stimulus responsive polymer (SRP).

Referring to FIG. 1A, an example of a method for bracing HAR structures using an SRP is shown. First at an operation 101, a substrate including HAR structures with a solvent is provided. HAR structures are structures having high aspect ratios (ARs), e.g., at least 8, 10, 20, 30, 40, or 80. The substrate may be provided, for example, after a wet etch or cleaning operation and have solvent associated with the prior operation. In some embodiments, the solvent in operation 101 may be a transitional solvent if the prior solvent is not chemically compatible with the SRP solution.

Next in an operation 103, the solvent is displaced with a solution that includes a stimuli responsive polymer (SRP). The substrate is then dried in an operation 105. The SRP precipitates out of solution and fills the HAR structures. A mechanical brace forms in the HAR structures to prevent collapse of the structures due to capillary forces that are generated during solvent drying.

The substrate is then exposed to a stimulus, such as light, heat, or chemistry that degrades the SRP in an operation 107. In some embodiments, operation 107 involves controlled exposure to a compound or to two reactants that react to form a compound that degrades the SRP. The stimulus is any compound that scissions bonds of the SRP to degrade it. In some embodiments, the compound is a relatively strong acid or base. Monomers or fragments from the degraded polymer remaining on the substrate can then be further removed from the structure in an operation 109. In some embodiments, exposure to metastable species from a noble gas plasma is performed during operations 107 and/or 109.

Figure 1B:
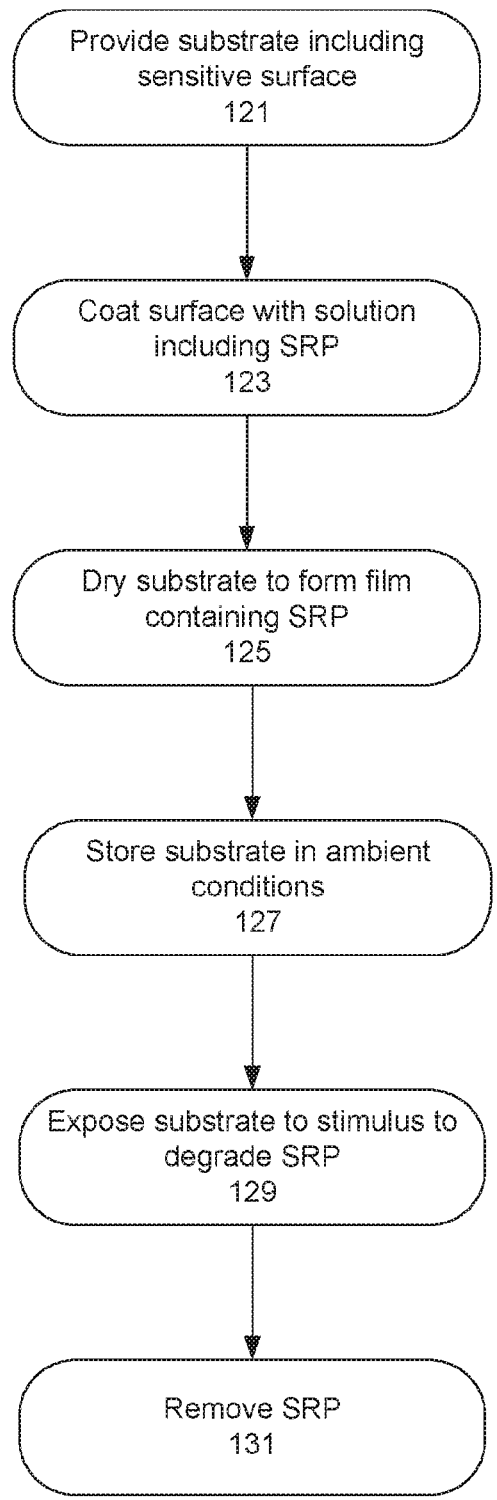
FIG. 1B is a flow diagram showing an example of a method of protecting a sensitive surface during semiconductor process using an SRP.

SRPs may also be used in the semiconductor fabrication processes for transient protection of a sensitive surface of substrate. This in turn can extend available queue time. FIG. 1B shows an example of a method for protection of a sensitive surface of a substrate. At operation 121, a substrate including an environmentally sensitive surface is provided. The surface may be a planar surface or include one or more pillars, holes, and trenches, including HAR structures. Examples of substrate surfaces that can be sensitive to environmental queue time effects include silicon, silicon germanium, and germanium structures such as fins and nanowires, metal surfaces including but not limited to copper, titanium, titanium nitride, cobalt, tungsten or molybdenum, and/or other structures and materials.

The surface is then coated with a solution including an SRP in an operation 123. The substrate is then dried in an operation 125, forming a protective coating including SRP on the sensitive substrate. The substrate can then be stored in ambient conditions in an operation 127. When ready for further processing, the substrate is exposed to a stimulus, such as light, heat, or a chemistry that degrades the SRP in an operation 129. Volatile monomers or fragments from the degraded polymer can then be removed from the structure in an operation 131.

FIGS. 1A and 1B are flow diagrams showing certain operations in example semiconductor fabrication processes that use SRPs, though the methods described herein are not limited to particular applications but may be used with any application in which SRPs are removed from any surface.

SRPs

The SRPs as described herein are polymers that are in thermal equilibrium with their constituent monomers at a ceiling temperature (Tc). On exposure to an appropriate stimulus, an SRP is de-polymerized with the monomer products easily removed from the surface of the substrate. The ceiling temperature is an intrinsic property of the polymer. According to various embodiments, the SRPs have ceiling temperatures between −80° C. and 400° C.

In many embodiments, the SRPs are low ceiling temperature (Tc) polymers. As used herein, the term low Tc refers to Tc values below a removal temperature. In some embodiments, the Tc is below room temperature, such that the polymers are thermodynamically unstable at room temperature. Instead, the low Tc polymer is kinetically trapped to allow prolonged storage at room temperature. In some examples, the stable storage period is on the order of months or years. Low Tc polymers will rapidly de-polymerize to its monomer constituents if an end-group or main chain bond is broken. Thus, the polymer de-polymerizes in response to stimuli such as ultraviolet (UV) light, heat, thermal catalyst, photocatalyst, or an acidic/basic catalyst. The monomer products are volatile and leave or can be easily removed from the surface and chamber.

While in some embodiments, the Tc is below room temperature, in the context of semiconductor processing, low Tc may also refer to ceiling temperatures that are higher than room temperature. For example, removal temperatures of up to 400° C. may be used, meaning that the ceiling temperature is below 400° C. In some embodiments, the SRP is characterized by having a Tc below 200° C. In some embodiments, the SRP is characterized by having a Tc between −80° C. and 200° C., between −80° C. and 150° C., or between −80° C. and 100° C. In some embodiments, having a ceiling temperature of no more than about 100° C. is advantageous such that de-polymerization into constituent monomers can occur without burning or charring the SRP.

Example of SRPs are provided below. However, the methods described herein may be used with any SRPs. In some embodiments, the SRPs are co-polymers or homopolymers including poly(aldehydes). Non-limiting examples of homopolymer or constituent polymers of a copolymer in SRPs include a poly(phthalaldehyde), a poly(aldehyde), a poly(benzyl carbamate), a poly(benzyl ether), a poly(alpha-methyl styrene), a poly(carbonate), a poly(norbornene), a poly(olefin sulfone), a poly(glyoxylate), a poly(ester), or a poly(methyl methacrylate), as well as derivatives thereof. Such derivatives can include replacement of oxy (—O—) with an optionally substituted heteroalkylene, as defined herein, as well as substitutions with one or more substitution groups, as described herein for alkyl.

In some embodiments, the SRP is a homopolymer. Such a polymer can have any useful number n of monomers, such as n is from about 2 to about 100,000 (e.g., about 2 to 50, 2 to 100, 2 to 200, 2 to 300, 2 to 400, 2 to 500, 2 to 1,000, 2 to 2,000, 2 to 5,000, 2 to 10,000, 2 to 20,000, 2 to 50,000, 2 to 100,000, 3 to 50, 3 to 100, 3 to 200, 3 to 300, 3 to 400, 3 to 500, 3 to 1,000, 3 to 2,000, 3 to 5,000, 3 to 10,000, 3 to 20,000, 3 to 50,000, 3 to 100,000, 4 to 50, 4 to 100, 4 to 200, 4 to 300, 4 to 400, 4 to 500, 4 to 1,000, 4 to 2,000, 4 to 5,000, 4 to 10,000, 4 to 20,000, 4 to 50,000, 4 to 100,000, 5 to 50, 5 to 100, 5 to 200, 5 to 300, 5 to 400, 5 to 500, 5 to 1,000, 5 to 2,000, 5 to 5,000, 5 to 10,000, 5 to 20,000, 5 to 50,000, 5 to 100,000, 10 to 50, 10 to 100, 10 to 200, 10 to 300, 10 to 400, 10 to 500, to 1,000, 10 to 2,000, 10 to 5,000, 10 to 10,000, 10 to 20,000, 10 to 50,000, 10 to 100,000, 50 to 100, 50 to 200, 50 to 300, 50 to 400, 50 to 500, 50 to 1,000, 50 to 2,000, 50 to 5,000, 50 to 10,000, 50 to 20,000, 50 to 50,000, 50 to 100,000, 100 to 200, 100 to 300, 100 to 400, 100 to 500, 100 to 1,000, 100 to 2,000, 100 to 5,000, 10 to 10,000, 100 to 20,000, 100 to 50,000, and 100 to 100,000). In other embodiments, the polymer is cyclic, in which n is from about 3 to about 100. In other embodiments, the cyclic polymer includes any useful number n1+2 of monomers, such as n1 from about 1 to about 100.

In particular embodiments, the SRPs may also be any appropriate linear or cyclic copolymer including the pure phthalaldehyde homopolymer, a homopolymer of poly(phthalaldehyde) derivatives such as poly(4,5-dichlorophthalaldehyde), or a homopolymer of poly(aldehyde) derivatives.

In some embodiments, the SRPs are copolymers including poly(aldehydes). In particular embodiments, they may be self-immolative polymers as described in U.S. Patent Publication No. 2018/0155483, which was published on Jun. 7, 2018 and which is hereby incorporated herein by reference in its entirety. Examples of copolymers reference include those of Formula (1):

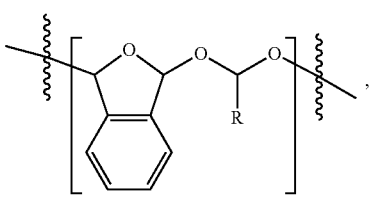

(I)

wherein:

R is substituted or unsubstituted C1-20 alkyl, C1-20 alkoxy, C2-20 alkenyl, C2-20 alkynyl, C6-10 heteroaryl, C3-10 cycloalkyl, C3-10 cycloalkenyl, C3-10 heterocycloalkyl, or C3-10 heterocycloalkenyl; and, when substituted, R is substituted with C1-20 alkyl, C1-20 alkoxy, C2-20 alkenyl, C2-20 alkynyl, C6-10 aryl, C6-10 heteroaryl, carboxyaldehyde, amino, sulfonic acid, sulfinic acid, fluoroacid, phosphonic acid, ether, halo, hydroxyl, ketone, nitro, cyano, azido, silyl, sulfonyl, sulfinyl, or thiol.

In particular embodiments, the SRPs are cyclic copolymers of the phthalaldehyde monomer with a second aldehyde such as ethanal, propanal, or butanal. Examples of such copolymers are given in U.S. Patent Publication No. 2018/0155483 as Formula (11):

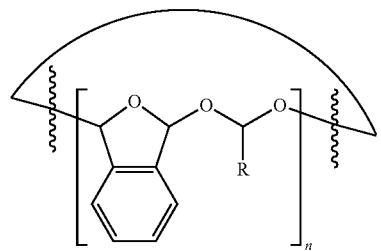

wherein n is an integer from 1 to 100,000 and R can be any described herein (e.g., such as for Formula (1)).

Specific examples in U.S. Patent Publication No. 2018/0155483 include copolymers of phthalaldehyde and one or more of acetaldehyde, propanal, butanal, pentanal, hexanal, heptanal, octanal, nonanal, decanal, undecanal, propenal, butenal, pentenal, hexenal, heptenal, octenal, nonenal, decenal, undecenal, and any combination thereof.

The SRPs may also be any appropriate linear or cyclic copolymer including the pure phthalaldehyde homopolymer. It also may be a homopolymer of poly(phthalaldehyde) derivatives such as poly(4,5-dichlorophthalaldehyde).

In particular embodiments, the SRP is formed with no unwanted side products. In this way, residue-free vaporization of the polymer can be achieved because side products need not be removed. For removal, scission of one (or few) chemical bonds within the SRP propagates full, rapid depolymerization of the polymer. Since all the bonds are the same (no inadvertent impurities), little or no residue is expected.

The SRP, or a formulation thereof, can be deposited in any useful manner. For instance, the SRP can be spin-coated or vapor deposited.

SRP Formulations

In some embodiments, the SRP is formulated with an organic weak acid. Organic weak acids are organic acids having a pKa≥1, with examples including tartaric acid and oxalic acid. Examples include linear alkyl carboxylic acids, CXH2XO2, where X is an integer, and the corresponding dicarboxylic acid variants. Particular examples include including methanoic acid (X=1) and acetic acid (X=2). Particular examples of dicarboxylic acids include ethanedioic acid and propanedioic acid. The organic weak acid may also be variants of any of these with additional alcohol substitutions and/or unsaturated bonds. For example, oxoethanoic acid, 2-hydroxyethanoic acid, prop-2-enoic acid, 2-propynoic acid, 2-hydroxypropanedioic acid, oxopropanedioic acid, 2,2-dihydroxypropanedioic acid, 2-oxopropanoic acid, 2-hydroxypropanoic acid, 3-hydroxypropanoic acid, 2,3-dihydroxypropanoic acid, etc. may be used.

According to various embodiments, an SRP formulation may include a solvent, the SRP, and the organic weak acid. In some embodiments, the solution is provided as 1-20 or 5-20 wt % SRP and <1 wt % organic weak acid, with the balance being the solvent. In some embodiments, the organic weak acid loading is as low as one part per thousand of the loading of the SRP, and still provides benefit. The formulation may include one or more additional components. Such additional components may include stabilizers, surfactants, and/or plasticizers. And as described further below, the formulation may include one or more acid generators. The solution is provided as 1-20 wt % or 5-20 wt % SRP and <1 wt % organic weak acid, additional components, and solvent. The additional components, if present, may total less than 5 wt % of the formulation in some embodiments.

While the formulations with less than 1 wt % organic weak acid can be used, the formulations with substantially more organic weak acid may be stable for certain applications. In some embodiments, up to 20 wt % weak organic acid may be used. The upper limit of the organic weak acid is the level at which a formulation is shelf stable. This can depend on the particular acid, its pKa, and how many protons it generates, as well as the application. For high throughput applications that may only be on the shelf for a day or two, it can be at the higher end of the range. For applications in which shelf stability of weeks is desired, the organic weak acid may be closer to or below 1 wt %.

Example solvents include diglyme, tetrahydrofuran, N-methyl-pyrrolidone, dimethylformamide, propylene carbonate, cyclopentanone, anisole, dichlorobenzene, propylene glycol methyl ether acetate, and 2-ethoxyethyl acetate. In some embodiments, the SRP and the organic weak acid may be formulated and stored as separate solutions but mixed together at point of deposition onto the wafer, or at some point relatively shortly beforehand. In some embodiments, the SRP and organic weak acid may be provided as a powder to be mixed in the solvent before spin coating. The SRP and organic weak acid may be provided with a relative wt % of at least 5:1 SRP:organic weak acid, or at least 10:1, or 20:1. If there is too much acid, the film stability may be compromised. As indicated above, in some embodiments, it may be acceptable to use a higher amount of organic weak acid, such as 1:1 SRP:organic weak acid.

SRP films that include an organic weak acid as described above are stable at room temperature but exhibit accelerated degradation characteristics compared to the neat SRP formulated without the organic weak acid.

The formulation, and thus the resultant film, can include a photoacid generator (PAG), in which exposure of the SRP to electromagnetic radiation produces acid. In this way, energetic light (e.g., UV light, IR lights, or x-rays) exposure generates acid to promote in situ degradation of the film. Non-limiting photoacid generators include onium salts, such as iodonium and sulfonium salts having perfluorinated anions (e.g., diaryliodonium and triarylsulfonium salts), bissulfonyldiazomethane compounds, N-sulfonyloxydicarboximide compounds, and O-arylsulfonyloxime compounds. The photoacid generator may optionally include a photosensitizer (e.g., having modified polyaromatic hydrocarbons or fused aromatic rings).

Other acid generators can be used, such as a thermal acid generator that releases acidic moieties upon exposure to heat. In this way, depolymerization of the SRP can include both thermal and acidic processes. Non-limiting examples of thermal acid generators include ammonium salts, sulfonyl esters, and acid amplifiers. In some embodiments, the formulation may include a plasticizer. Non-limiting examples include phthalate-based plasticizers such as, bis(2-ethylhexyl)phthalate, bis(2-propylheptyl)phthalate, diisononyl phthalate, butyl benzyl phthalate, di-n-butyl phthalate, diisodecyl phthalate, diisooctyl phthalate, diethyl phthalate, diisobutyl phthalate, and dihexylphthalate; trimelliates such as trimethyl trimellitate, tri(2-ethylhexyl)trimellitate, tri(octyl,decyl)trimellitate, and tri(heptyl,nonyl)trimellitate, octyltrimellitate; adipate-based plasticizers such as bis(2-ethylhexyl)adipate, dimethyl adipate, monomethyl adipate, and dioctyl adipate; sebacate-based plasticizers; maleate-plasticizers such as dibutyl maleate; glycols and polyethers; and surfactants.

According to various embodiments, an SRP may be pre-formulated with the appropriate acid at some point prior to use and then spin-coated onto the substrates for sacrificial bracing or surface protection applications. Alternatively, the SRP may be mixed with the acid at point of use, right before spin-coating. This latter approach may be used to prolong the shelf-life of the SRP in some embodiments, since although it is stable in film form (solid state), it may not be stable in solution once contacted with the acid.

Examples

Three formulations of SRP with 0, 0.5, and 20 parts per hundred per resin (pph resin) of D,L tartaric acid were made and spin-coated onto bare Si wafers to produce films between 90 and 150 nm. Upon baking the films at 135° C., the films containing the acid visibly degraded within seconds, while the film without acid did not change.

Additional films of these solutions were created and stored in air in a cleanroom. 10 days later, film thicknesses were measured, and found to be within 1 nm of the initial readings, confirming film stability. The bake test at 135° C. was repeated. The 20 pph resin loaded sample again degraded while the other two films did not degrade at this temperature.

| Acid Concentration | Depolymerization at 135° C. | | Depolymerization at Room Temperature |
|---|---|---|---|
| (pph resin) | Day 0 | Day 10 | Film loss at Day 10 |
| 0 | No apparent | No apparent | <1% |
| 0.5 | Yes | No apparent | <1% |
| 20 | Yes | Yes | <1% |

Degradation at day 10 for a 20 pph resin loaded sample was slower than at day 0 for the same loading. This is possibly due to poisoning of the film with base present in the ambient. Poisoning of the film also likely explains why the 0.5 pph resin sample degrades at 135 C on day 0 but does not appreciably degrade on day 10. Even with this, there was clearly a different response from the film containing the highest acid loading. The film would be expected to degrade quickly in high-volume manufacturing settings where queue-time is approximately four hours.

Figure 2:
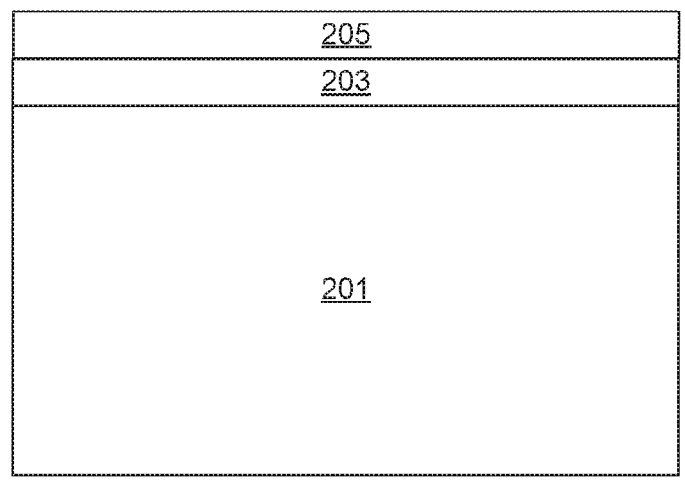
FIG. 2 shows a schematic example of a substrate including a surface protect with a multi-layer protection stack including an SRP layer and a cap layer.

Also provided herein are multi-layer transient protective films that include at least one SRP layer. FIG. 2 shows an example of a substrate 201 including a surface to be protected. A multi-layer film including SRP layer 203 and layer 205 is on the substrate surface and serves as a transient protective layer. For example, the multi-layer film may be implemented to protect surfaces as described above with respect to FIG. 1B.

In addition to the SRP layer, the multi-layer film includes one or more cap layers that provide protection from unwanted oxidation, corrosion, or halogenation due to exposure to ambient conditions. In the example of FIG. 1B, the cap layer may be formed after operation 125 and removed after operation 127 and prior to operation 129 in some embodiments.

In the example of FIG. 2, there is one cap layer 205, however additional cap layers of the same or different composition may be used. Examples of thicknesses may range from 2-1000 nm for an SRP layer, and from a few nm's to several microns for the one or more cap layers. Thicknesses may depend on storage ambient and length of time, for example.

The SRP layer 203 may include an SRP as described above. However, the SRP layer in a multi-layer transient protective film is not limited to those; any SRP that is responsive to stimuli (e.g., low temperature bake, UV radiation, chemical compounds, noble gas plasma) that are benign to the surface may be used. The SRP layer 203 may be spin-coated onto the surface or vapor deposited in a manner that does not damage the underlying surface.

The cap layer 205 may be a high-density material with little-to-no porosity or defects. The cap layer may be characterized as having greater moisture or oxygen barrier properties than the SRP. It is deposited in a manner that does not degrade the SRP material. In some embodiments, this involves thermal (non-plasma) deposition at temperatures less than 150° C. (or other temperature at which the SRP degrades). In some embodiments, there is no direct exposure of the SRP layer to a plasma. Example deposition processes can include electron-beam evaporation, various sputtering processes, atomic layer deposition, and chemical vapor deposition. Example cap layers can include oxide films such as SiOx, SnOx, AlOx, TiOx, ZrOx, HfOx, and ZnOx, and nitride films such as SiNx wherein x is a number greater than 0.

In some embodiments, the cap layer may be a polymer film. Such films can be vapor deposited (by chemical vapor deposition or physical vapor deposition). Other cap layers that may be vapor deposited include polymer-like films, resin films, and organic molecules. In some embodiments, polymers can be grown in situ from precursors delivered in the vapor phase.

Examples of cap layers that can be deposited by vapor deposition or solution-based deposition include polytetrafluoroethylene (PTFE), polyethylene (PE), polyacrylates (including derivatives, substituted forms, and copolymers thereof), polystyrene (including derivatives, substituted forms, and copolymers thereof), polyimides, polyamides, polyesters, polyurea, polyaldehydes, and polyurethanes.

The layer in contact with the sensitive surface generally contains the SRP, which can be removed in a benign way (e.g., UV or bake at 150° C.-300° C.) with little residue left behind. To construct the film, the SRP is first spin-coated or vapor deposited. Then one or more cap layers are subsequently deposited onto the SRP. Vapor-phase, low temperature, non-plasma CVD techniques may be used to avoid SRP degradation. For example, CVD deposition at a temperature of no more than or less than 150° C. may be used without radiation. Additionally, the cap layer may be spun cast on top of the SRP using a solvent that does not dissolve the SRP. Multiple different types of films may be deposited multiple times in a repeated stack to optimize protection of the surface.

In some embodiments, a first cap layer may be deposited by a mild CVD process to protect the SRP film followed by deposition by a harsher technique such as PECVD to grow faster, more robust films. The temperature of the substrate should generally below 150° C. (or other degradation temperature) of the SRP film throughout the entire process or exceed it for no more than a few seconds.

Figure 3:
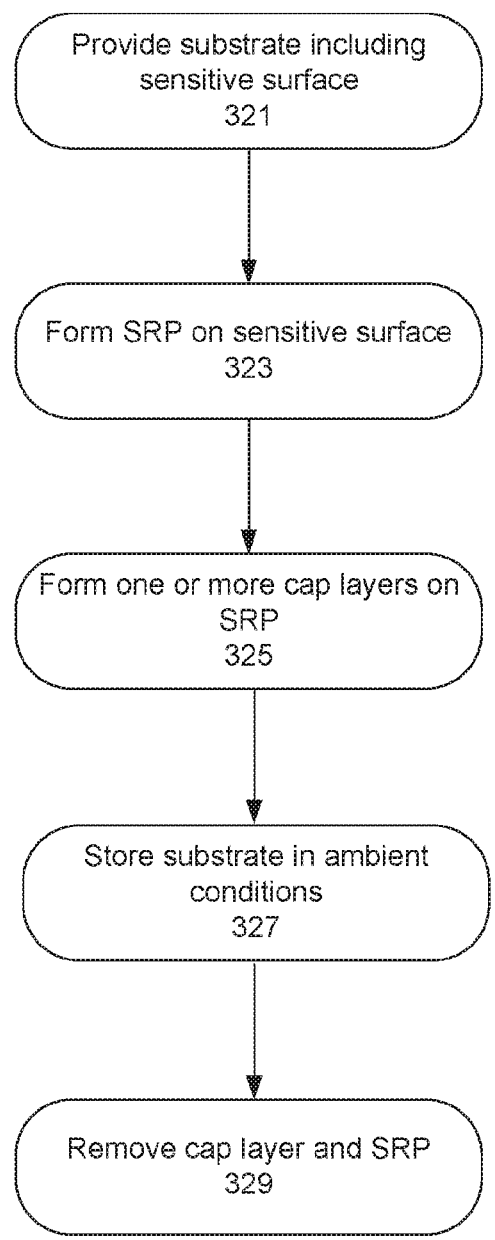
FIG. 3 is a flow diagram showing an example of a method of protecting a sensitive surface using a multi-layer protection stack.

FIG. 3 shows an example of a process that may be used in accordance with embodiments herein. First, in an operation 321, a substrate including an environmentally sensitive surface is provided. The surface may be a planar surface or include one or more pillars, holes, and trenches, including HAR structures. Examples of substrate surfaces that can be sensitive to environmental queue time effects include silicon, silicon germanium, and germanium structures such as fins and nanowires, metal surfaces including but not limited to copper, titanium, titanium nitride, cobalt, tungsten or molybdenum, and/or other structures and materials. Then, in an operation 323, an SRP is formed on the surface. In some embodiments, this can involve a solution-based method as described above. In other embodiments, the SRP may be vapor deposited. In an example of chemical vapor deposition, monomer precursors are delivered to the surface through the vapor phase and then polymerize to form the film. In some embodiments, an initiating species (e.g., tert-butyl peroxide) and monomer are simultaneously introduced through the vapor phase. The initiating species may be exposed to a heat, light, or other energy source to generate reactive radical or ionic species to conduct the polymerization of the monomer. In an example of physical vapor deposition, a relatively low molecular weight (<10 kDa) sample of a polymer with low intermolecular forces (e.g., polyethylene or polytetrafluoroethylene) are heated in vacuum in proximity to the substrate, and the polymers desorb and reabsorb onto the substrate, creating a polymer film. In an operation 325, a cap layer is formed on the SRP. This also may be done by vapor deposition. Solution-based methods may be performed depending the cap material. The substrate is then stored in ambient conditions in an operation 327. When ready for further processing of the substrate, the cap layer and the SRP are removed in an operation 329. Operation 329 can be a single operation or multiple operations. Further, the one or more cap layers and the SRP can be removed in the same or different operations.

Removing the one or more cap layers can involve using a plasma or solvent to degrade these layers, turning off the plasma or removing the solvent before the SRP itself is fully removed. The surface can then be baked under vacuum or at ambient to drive off the SRP, leaving behind the clean surface of interest, which protected from the harsh chemistries or conditions used to remove the cap layers.

In some embodiments, the one or more cap layers may be peeled-off by attaching them with an adhesive to another substrate, while the first substrate remains chucked or affixed to some kind of holder. The whole assembly is then heated while being pulled apart. Since the heating serves to degrade the SRP material, this spot is where the two halves separate, leaving behind a clean substrate free of the protecting film, while the bulk of the protecting film remains attached by the adhesive to the second substrate. Similarly, in some embodiments, the SRP film can be degraded to make it easy to remove, with gravity or other force used to separate the SRP and the overlaying cap layer(s).

Apparatus

Figure 4:
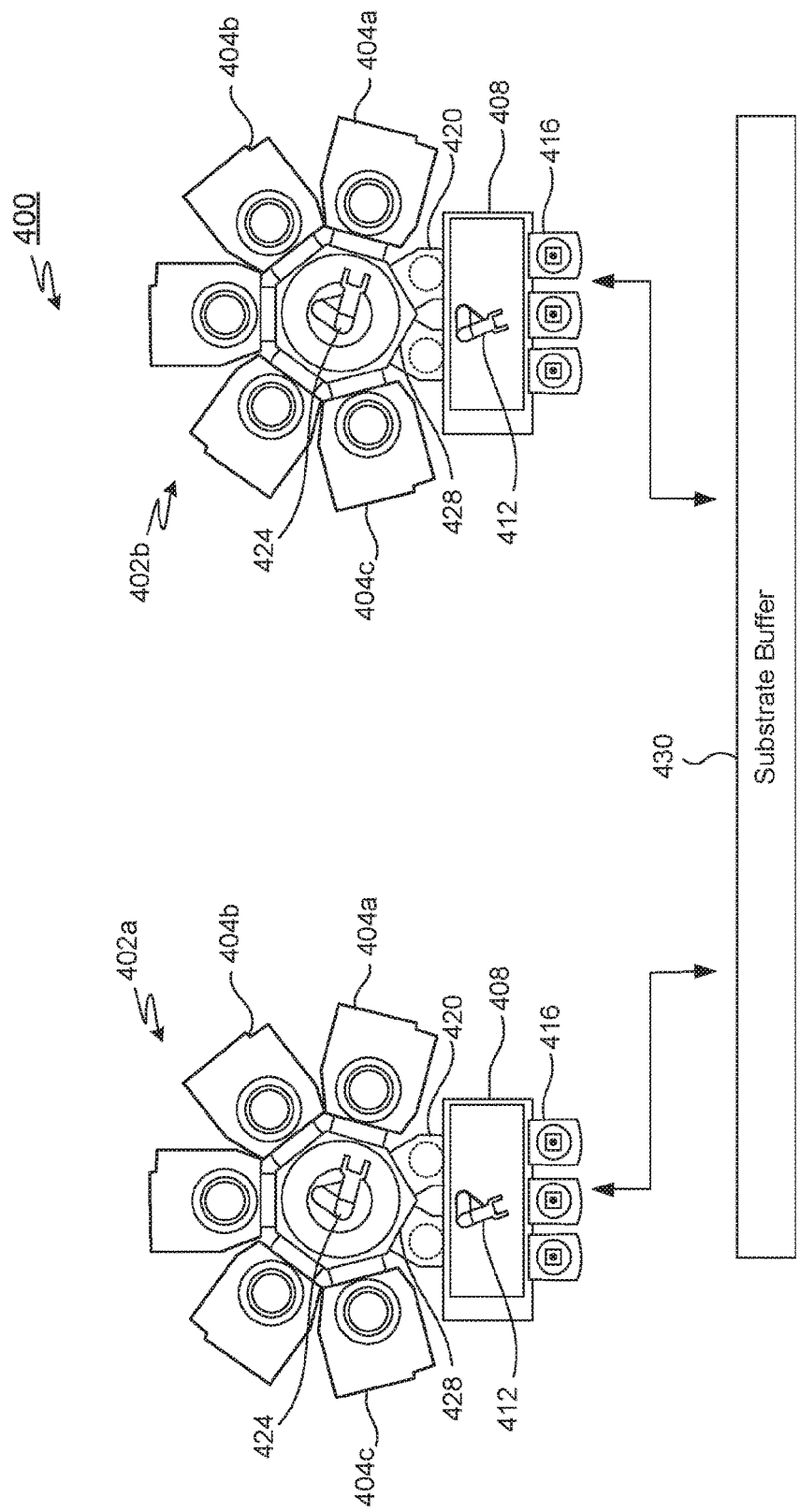
FIG. 4 shows an example of an apparatus that may be used to performed methods described herein.

The processes described above may be implemented in a chamber which may be part of a substrate processing system. The substrate processing system may further include one or more additional substrate processing tools used to process substrates including deposition of SRPs and upstream and downstream processing. Referring now to FIG. 4, a substrate processing system 400 includes one or more substrate processing tools 402 (substrate processing tools 402a and 402b are shown for illustration purposes) and substrate buffer 430 or other substrate storage. Each of the substrate processing tools 402a and 402b includes a plurality of processing chambers 404a, 404b, 404c, etc. (collectively processing chambers 404). For example only, each of the processing chambers 404 may be configured to perform a substrate treatment. In some examples, the substrates may be loaded into one of the processing chambers 404, processed, and then moved to one or more other ones of the processing chambers 404 and/or removed from the substrate processing tool 400 (e.g., if all perform the same treatment).

Substrates to be processed are loaded into the substrate processing tools 402a and 402b via ports of a loading station of an atmosphere-to-vacuum (ATV) transfer module 808. In some examples, the ATV transfer module 408 includes an equipment front end module (EFEM). The substrates are then transferred into one or more of the processing chambers 404. For example, a transfer robot 412 is arranged to transfer substrates from loading stations 416 to load locks 420. A vacuum transfer robot 424 of a vacuum transfer module 428 is arranged to transfer substrates from the load locks 420 to the various processing chambers 404.

After processing in one or more of the substrate processing tools 402a and 402b, the substrates may be transported outside of a vacuum environment. For example, the substrates may be moved to a location for storage (such as the substrate buffer 430). In other examples, the substrates may be moved directly from the substrate processing tool to another substrate processing tool for further processing or from the storage buffer 430 to another substrate processing tool for further processing.

Exposure of the substrate to ambient conditions may cause defects or otherwise adversely impact downstream processing. A sacrificial protective layer including an SRP can be added to the substrate prior to exposure to ambient conditions. In some examples, the sacrificial protective layer is applied in the substrate processing tool prior to transferring the substrate to the substrate buffer for storage or to another substrate processing tool. In other examples, the sacrificial protective layer is applied in another processing chamber (not associated with the substrate processing tool). For example, an SRP and one or more cap layers may be added in a substrate processing tool 402b.

Prior to performing another treatment on the substrate, the sacrificial protective layer is removed as described herein. For example, the substrate may be transferred to the substrate processing tool 402b after a period of storage in the storage buffer 430 or after processing in the substrate processing tool 402a. The sacrificial protective layer may be removed in one of the processing chambers in the substrate processing tool 402b, or another processing chamber (not associated with the substrate processing tool 802b). In some embodiments, the sacrificial protective layer is removed in a load lock 420.

In some examples, the sacrificial protective layer is applied by a processing chamber in the same substrate processing tool (that performed substrate treatment) prior to exposure to ambient conditions. Since the substrate processing tool operates at vacuum, exposure of the substrate to ambient conditions is prevented. In some examples, the sacrificial layer is deposited after a wet clean process. In this case, oxides and residues may be removed by the wet clean process and the sacrificial layer is deposited in sequence prior to drying the wafer or immediately after drying the wafer. In some examples, this process is not done under vacuum and is done without any exposure of the dry pristine surface to the ambient. In other examples, the substrate is transported from the substrate processing tool to another processing chamber located outside of the substrate processing tool that adds the sacrificial protective layer. Using this approach limits or reduces the period of exposure of the substrate to ambient conditions. Exposure is limited to a brief period of transport from the substrate processing tool to the processing chamber where the sacrificial protective layer is applied. Storage of the substrate may be performed for longer periods without additional exposure to ambient conditions. Subsequently, the sacrificial protective layer may be removed prior to further processing. In some examples, the sacrificial protective layer is removed in another substrate processing tool under vacuum conditions prior to substrate treatment in processing chambers of the same substrate processing tool. In other examples, the substrate is transported to a processing chamber that removes the sacrificial protective layer and then to the substrate processing tool for further processing. This approach also limits exposure to ambient conditions between the processing chamber and the substrate processing tool or other environment. In one example, the sacrificial protective layer is formed immediately after etch, deposition, or other process by exposing the substrate to a small molecule vapor that condenses on the surface to form a film. This can be performed directly inside the tool in which the etch or deposition occurred (e.g., substrate processing tool 402a) and may occur in the same processing chamber in which the etch or deposition occurred. The substrate is then taken to the next tool for processing (e.g., substrate processing tool 402b). Once the substrate is again no longer exposed to ambient conditions (for example by bringing the substrate under vacuum or an atmosphere purged with an inert gas), vacuum and compounds, and in some cases, other stimuli, as described above are applied to induce the film to degrade and be removed from the substrate. This may take place inside of a processing chamber as described above (e.g., process chamber 404a of substrate processing chamber 402b).

In various embodiments, a system controller is employed to control process conditions during processing including during the SRP removal. The controller will typically include one or more memory devices and one or more processors. A processor may include a CPU or computer, analog and/or digital input/output connections, stepper motor controller boards, etc.

The controller may control all the activities of a removal apparatus. The system controller executes system control software, including sets of instructions for controlling the timing, mixture of gases, chamber pressure, chamber temperature, wafer temperature, wafer chuck or pedestal position, plasma power, and other parameters of a particular process. Other computer programs stored on memory devices associated with the controller may be employed in some embodiments.

Typically, there will be a user interface associated with the controller. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the reactant pulses and purge gas flows and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, substrate temperature, and plasma power. These parameters are provided to the user in the form of a recipe and may be entered utilizing the user interface.

Signals for monitoring the process may be provided by analog and/or digital input connections of the system controller. The signals for controlling the process are output on the analog and digital output connections of the system.

The system software may be designed or configured in many ways.

For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. The parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a PVD chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck. A plasma power program may control plasma power.

Examples of chamber sensors that may be monitored during removal include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method comprising:
    forming an SRP layer, wherein the SRP layer is a layer comprising a stimulus responsive polymer (SRP), the SRP characterized by a ceiling temperature ($T_c$) at which the SRP is in thermal equilibrium with its monomers, the $T_c$ being between $-80°$ C. and $400°$ C., on a sensitive surface of a substrate; and forming one or more cap layers on the SRP layer, wherein the SRP layer and the one or more cap layers are configured to protect the sensitive surface from environmental effects during queue-time in a fabrication facility.

2. The method of claim 1, further comprising exposing the substrate including the SRP layer and one or more cap layers to ambient conditions for a predetermined period.

3. The method of claim 2, further comprising removing the one or more cap layers and the SRP layer.

4. The method of claim 3, wherein the one or more cap layers are removed prior to completing removal of the SRP layer.

5. The method of claim 2, wherein the one or more cap layers are removed by peeling.

6. The method of claim 2, wherein the one or more cap layers are removed by exposure to a solvent or plasma.

7. The method of claim 6, wherein the solvent is removed or the plasma is extinguished while the SRP layer is covering the sensitive surface.

8. The method of claim 2, wherein removing the one or more cap layers comprises depolymerizing the SRP and lifting off the one or more cap layers from the substrate.

9. The method of claim 1, wherein forming the one or more cap layers comprises maintaining the substrate temperature at no more than the ceiling temperature of the SRP.

10. The method of claim 1, wherein the one or more cap layers are inorganic layers.

11. The method of claim 1, wherein the one or more cap layers include one or more of: $SiO_x$, $SnO_x$, $AlO_x$, $TiO_x$, $ZrO_x$, $HfO_x$, and $ZnO_x$, and nitride films such as $SiN_x$ wherein x is a number greater than 0.

12. The method of claim 1, wherein the one or more cap layers include one or more polymer layers.

13. The method of claim 1, wherein the SRP comprises a poly(phthalaldehyde), a poly(aldehyde), a poly(benzyl carbamate), a poly(benzyl ether), a poly(alpha-methyl styrene), a poly(carbonate), a poly(norbornene), a poly(olefin sulfone), a poly(glyoxylate), a poly(ester), or a poly(methyl methacrylate), as well as derivatives thereof, as a homopolymer or a constituent polymer of a co-polymer.

14. The method of claim 1, wherein one of the one or more cap layers is polytetrafluoroethylene, polyethylene polyacrylates, polystyrene, polyimides, polyamides, polyesters, polyurea, polyaldehydes, and polyurethanes.

15. The method of claim 1, wherein the SRP and the one or more cap layers are deposited by vapor deposition.

16. The method of claim 1, wherein the one or more cap layers and the SRP layer are configured to be removed from the substrate.

17. A formulation comprising:
    a stimulus responsive polymer (SRP) characterized by a ceiling temperature ($T_c$) at which the SRP is in thermal equilibrium with its monomers, the $T_c$ being between $-80°$ C. and $400°$ C.; and
    an organic acid having a pKa≥1, wherein the SRP: organic acid wt % is at least 1:1.

18. The formulation of claim 17, wherein the SRP comprises a poly(phthalaldehyde), a poly(aldehyde), a poly(benzyl carbamate), a poly(benzyl ether), a poly(alpha-methyl styrene), a poly(carbonate), a poly(norbornene), a poly(olefin sulfone), a poly(glyoxylate), a poly(ester), or a poly(methyl methacrylate), as well as derivatives thereof, as a homopolymer or a constituent polymer of a co-polymer.

19. The formulation of claim 17, wherein the SRP and organic acid are in a solution, the solution comprising a solvent, the SRP, and the organic acid, wherein the wt % of the SRP in the solution is between 1% and 20%.

20. The formulation of claim 17 wherein the organic acid is a linear alkyl carboxylic acid $C_xH_{2x}O_2$, where X is an integer, a corresponding dicarboxylic acid variant, or a derivative thereof.

21. The formulation of claim 17, wherein the organic acid is one of methanoic acid, acetic acid, oxalic acid, tartaric acid, ethanedioic acid, propanedioic acid, oxoethanoic acid, 2-hydroxyethanoic acid, prop-2-enoic acid, 2-propynoic acid, 2-hydroxypropanedioic acid, oxopropanedioic acid, 2,2-dihydroxypropanedioic acid, 2-oxopropanoic acid, 2-hydroxypropanoic acid, 3-hydroxypropanoic acid, and 2,3-dihydroxypropanoic acid.

22. A processing tool comprising
    one or more semiconductor processing chambers connected under vacuum; and
    a controller comprising instructions for
        a) forming an SRP layer, wherein the SRP layer is a homogenous layer comprising a stimulus responsive polymer (SRP), the SRP characterized by a ceiling temperature (Tc) at which the SRP is in thermal equilibrium with its monomers, the Tc being between −80° C. and 400° C., on a sensitive surface of a substrate; and b) forming one or more cap layers on the SRP layer.

* * * * *